US008336016B2

(12) United States Patent
Baumgartner et al.

(10) Patent No.: US 8,336,016 B2
(45) Date of Patent: Dec. 18, 2012

(54) ELIMINATING, COALESCING, OR BYPASSING PORTS IN MEMORY ARRAY REPRESENTATIONS

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 12/775,622

(22) Filed: May 7, 2010

(65) Prior Publication Data

US 2011/0276931 A1    Nov. 10, 2011

(51) Int. Cl.
*G06F 17/50* (2006.01)
(52) U.S. Cl. ...................................... 716/132
(58) Field of Classification Search .................. 716/100, 716/132
See application file for complete search history.

(56) References Cited

U.S. PATENT DOCUMENTS

| | | | |
|---|---|---|---|
| 5,255,239 A | 10/1993 | Taborn et al. | |
| 5,377,123 A | 12/1994 | Hyman | |
| 5,644,498 A | 7/1997 | Joly et al. | |
| 5,708,612 A | 1/1998 | Abe | |
| 5,748,527 A | 5/1998 | Lee et al. | |
| 5,818,726 A | 10/1998 | Lee | |
| 5,918,035 A | 6/1999 | Van Praet et al. | |
| 5,953,283 A | 9/1999 | Meltzer et al. | |
| 6,356,485 B1 * | 3/2002 | Proebsting | 365/189.16 |
| 6,374,205 B1 | 4/2002 | Kuribayashi et al. | |
| 6,374,390 B1 | 4/2002 | Quarles et al. | |
| 6,378,112 B1 | 4/2002 | Martin et al. | |
| 6,425,116 B1 | 7/2002 | Duboc et al. | |
| 6,449,747 B2 | 9/2002 | Wuytack et al. | |
| 6,532,440 B1 | 3/2003 | Boppana et al. | |
| 6,611,952 B1 | 8/2003 | Prakash et al. | |
| 6,636,939 B1 | 10/2003 | George | |
| 6,654,849 B1 | 11/2003 | Brockman et al. | |
| 6,698,003 B2 | 2/2004 | Baumgartner et al. | |
| 6,717,884 B2 | 4/2004 | Kim | |
| 6,748,573 B2 | 6/2004 | Baumgartner et al. | |

(Continued)

FOREIGN PATENT DOCUMENTS

EP    1770495 A1    4/2007

(Continued)

OTHER PUBLICATIONS

USPTO U.S. Appl. No. 12/771,404.

(Continued)

*Primary Examiner* — Suchin Parihar
(74) *Attorney, Agent, or Firm* — Stephen R. Tkacs; Stephen J. Walder, Jr.; Diana R. Gerhardt

(57) ABSTRACT

Mechanisms are provided in a design environment for eliminating, coalescing, or bypassing ports. The design environment comprises one mechanism to eliminate unnecessary ports in arrays using disabled and disconnected pin information. The design environment may comprise another mechanism to combine and reduce the number of array ports using address comparisons. The design environment may comprise another mechanism to combine and reduce the number of array ports using disjoint enable comparisons. The design environment may comprise one mechanism to combine and reduce the number of array ports using "don't care" computations. The design environment may comprise another mechanism to reduce the number of array ports through bypassing write-to-read paths around arrays.

23 Claims, 17 Drawing Sheets

U.S. PATENT DOCUMENTS

| | | |
|---|---|---|
| 6,763,505 B2 | 7/2004 | Baumgartner et al. |
| 6,847,927 B2 | 1/2005 | Hoffman et al. |
| 7,006,370 B1 | 2/2006 | Ramesh et al. |
| 7,069,523 B2 | 6/2006 | Nation et al. |
| 7,194,724 B2 | 3/2007 | Hattori et al. |
| 7,260,799 B2 | 8/2007 | Baumgartner et al. |
| 7,290,228 B2 | 10/2007 | Guenther et al. |
| 7,299,432 B2 | 11/2007 | Baumgartner et al. |
| 7,340,577 B1 * | 3/2008 | Van Dyke et al. ............ 711/169 |
| 7,367,002 B2 | 4/2008 | Baumgartner et al. |
| 7,386,818 B2 | 6/2008 | Ganai et al. |
| 7,398,484 B2 | 7/2008 | Ruf |
| 7,448,005 B2 | 11/2008 | Baumgartner et al. |
| 7,506,297 B2 | 3/2009 | Mukherjee et al. |
| 7,512,925 B2 | 3/2009 | Birmiwal et al. |
| 7,523,380 B1 | 4/2009 | Trimberger |
| 7,934,180 B2 | 4/2011 | Baumgartner et al. |
| 7,962,880 B2 | 6/2011 | Lipetz et al. |
| 8,001,498 B2 | 8/2011 | Bjesse |
| 8,146,034 B2 | 3/2012 | Baumgartner et al. |
| 2001/0052106 A1 | 12/2001 | Wuytack et al. |
| 2003/0065965 A1 | 4/2003 | Korobkov |
| 2003/0123319 A1 | 7/2003 | Kim |
| 2004/0039893 A1 | 2/2004 | Lyon |
| 2004/0117744 A1 | 6/2004 | Nation et al. |
| 2005/0091475 A1 | 4/2005 | Sodani |
| 2006/0136849 A1 | 6/2006 | Greenberg et al. |
| 2007/0067746 A1 | 3/2007 | Baumgartner et al. |
| 2007/0121499 A1 | 5/2007 | Pal et al. |
| 2008/0066034 A1 | 3/2008 | Baumgartner et al. |
| 2008/0120085 A1 | 5/2008 | Alexanian et al. |
| 2008/0134114 A1 | 6/2008 | Bjesse et al. |
| 2008/0144421 A1 | 6/2008 | Deng et al. |
| 2009/0013301 A1 | 1/2009 | Ogilvie et al. |
| 2009/0119428 A1 * | 5/2009 | Chow et al. .................... 710/107 |
| 2009/0144674 A1 * | 6/2009 | Koithyar et al. .................. 716/4 |
| 2009/0190386 A1 | 7/2009 | Ki Kim |
| 2009/0228848 A1 * | 9/2009 | Kumazaki ......................... 716/5 |
| 2010/0020605 A1 | 1/2010 | Aritome |
| 2010/0097837 A1 | 4/2010 | Paul |
| 2010/0107132 A1 | 4/2010 | Bjesse |
| 2010/0293513 A1 | 11/2010 | Baumgartner et al. |
| 2011/0066578 A1 * | 3/2011 | Chong et al. .................... 706/12 |
| 2011/0145780 A1 * | 6/2011 | Chen ............................ 716/137 |
| 2011/0270597 A1 | 11/2011 | Baumgartner et al. |
| 2011/0271242 A1 | 11/2011 | Baumgartner et al. |
| 2011/0271243 A1 | 11/2011 | Baumgartner et al. |
| 2011/0271244 A1 | 11/2011 | Baumgartner et al. |
| 2011/0276930 A1 | 11/2011 | Baumgartner et al. |
| 2011/0276931 A1 * | 11/2011 | Baumgartner et al. ....... 716/106 |
| 2011/0276932 A1 * | 11/2011 | Baumgartner et al. ....... 716/106 |
| 2011/0307663 A1 * | 12/2011 | Kultursay et al. ............. 711/125 |
| 2012/0179806 A1 * | 7/2012 | Torii ............................. 709/223 |

FOREIGN PATENT DOCUMENTS

| | | |
|---|---|---|
| JP | 06162139 A2 | 6/1994 |
| JP | 09035497 A | 2/1997 |
| JP | 2008541331 | 11/2008 |

OTHER PUBLICATIONS

USPTO U.S. Appl. No. 12/771,479.
USPTO U.S. Appl. No. 12/771,613.
USPTO U.S. Appl. No. 12/771,677.
USPTO U.S. Appl. No. 12/775,607.
USPTO U.S. Appl. No. 12/775,633.
Bardell, PH et al., "Random Pattern Testability of the Logic Surrounding Memory Arrays", IBM technical Disclosure Bulletin, IPCOM000039582D, Jul. 1987, pp. 521-528.
Baumgartner, J et al., "Maximal Input Reduction of Sequential Netlists via Synergistic Reparameterization and Localization Strategies", Correct Hardware Design and Verification Methods, 13th IFIP WG 10.5 Advanced Research Working Conference, CHARME 2005, Proceedings 3-6, Saarbrucken, Germany, Oct. 2005, 1 page.
Burch, Jerry R. et al., "Automatic Verification of Pipelined Microprocessor Control", Lecture Notes in Computer Science, vol. 818, Proceedings of the 6th International Conference on Computer Aided Verification, Year of Publication: 1994, pp. 68-80.
Pandey, M et al., "Formal Verification of Memory Arrays Using Symbolic Trajectory Evaluation", IEEE International Workshop on Memory Technology, Design and Testing (MTDT 1997), pp. 42.
Ray, Sandip et al., "Abstracting and Verifying Flash Memories", http://userweb.cs.utexas.edu/~sandip/publications/flash-nvm-08/flash.pdf, <retrieved on Mar. 10, 2010, 5 pages.
Velev, Miroslav et al., "Efficient Modeling of Memory Arrays in Symbolic Simulation", Computer Aided Verification, vol. 1254/1997, Jun. 1997, pp. 388-399.
Notice of Allowance mailed Jan. 12, 2012 for U.S. Appl. No. 12/771,613; 11 pp.
Notice of Allowance mailed Nov. 29, 2011 for U.S. Appl. No. 12/771,677; 11 pp.
Office Action mailed Oct. 24, 2011 for U.S. Appl. No. 12/775,633; 15 pp.
Notice of Allowance mailed Feb. 28, 2012 for U.S. Appl. No. 12/775,633; 7 pages.
Office Action mailed Jan. 23, 2012 for U.S. Appl. No. 12/771,404; 9 pp.
Office Action mailed Mar. 8, 2012 for U.S. Appl. No. 12/775,607; 18 pages.
Response to Office Action filed with the USPTO on Jan. 24, 2012 for U.S. Appl. No. 12/775,633, 11 pages.
Response to Office Action filed with the USPTO on Apr. 18, 2012 for U.S. Appl. No. 12/771,404, 12 pages.
Notice of Allowance mailed Apr. 23, 2012 for U.S. Appl. No. 12/771,404; 9 pages.
Notice of Allowance mailed Jun. 1, 2012 for U.S. Appl. No. 12/775,633; 6 pages.
Notice of Allowance mailed Jun. 25, 2012 for U.S. Appl. No. 12/775,607; 10 pages.
Response to Office Action filed with the USPTO on Jun. 8, 2012 for U.S. Appl. No. 12/775,607, 10 pages.
Ganai, Malay K. et al., "Verification of Embedded Memory Systems using Efficient Memory Modeling", Proceedings of the Design, Automation and Test in Europe Conference and Exhibition (Date'05), vol. 2, 2005, 6 pages.
Mishchenko, Alan et al., "SAT-Based Complete Don't-Care Computation for Network Optimization", Proceedings of the conference on Design, Automation and Test in Europe (Date/05), vol. 1, 2005, 8 pages.

* cited by examiner

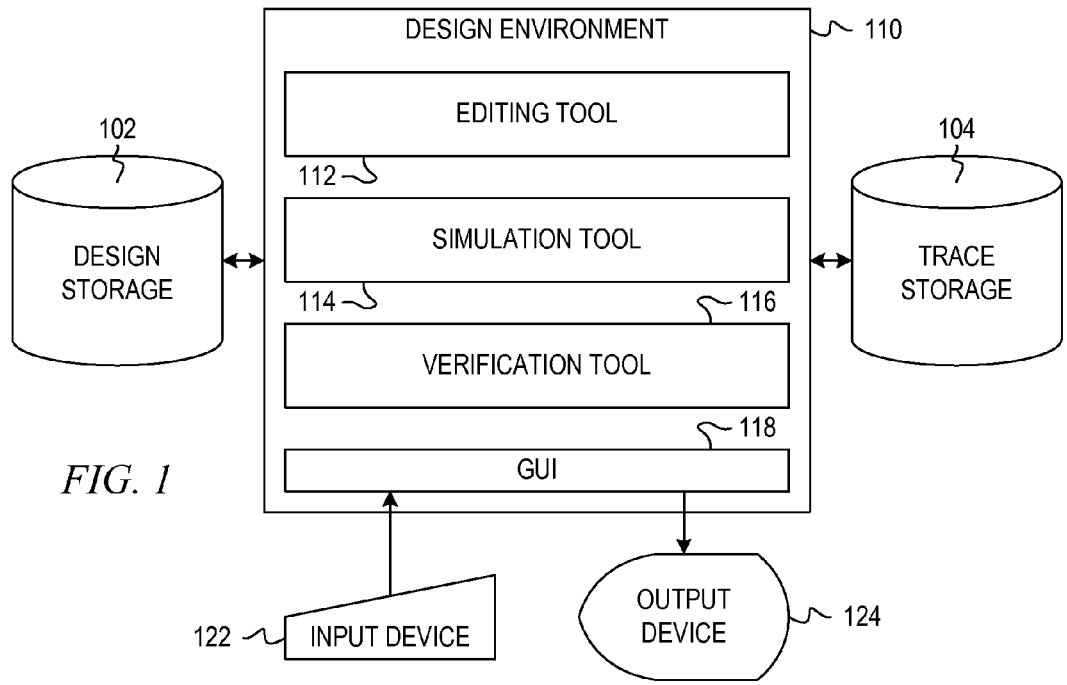

```
void compress_width(array arr) {
 for each column j in arr check if any read port R_i in arr has R_i.data(j) connected if not, compress column j out of the array by projecting that column out of the data pins of each port
}
```

FIG. 5

```
void delete_ports(array arr) {
 for each port type T in (Read, Init, Write)
  for each port T_i in (T_1, ..., T_n)
   if(T_i.enable == 0) OR // port can never be enabled
    (no data pins of T_i are connected)
     if(T == Read) convert each arrayout from T_i to a RANDOM gate
     delete port T_i
}
```

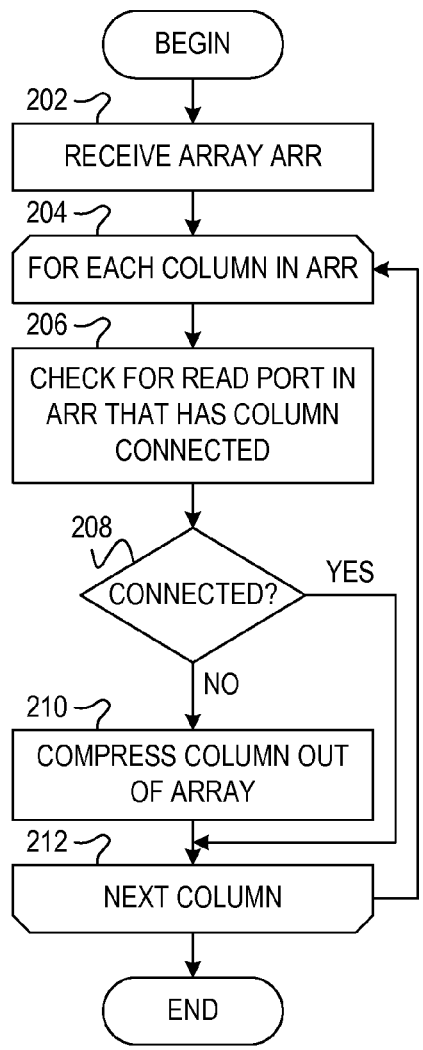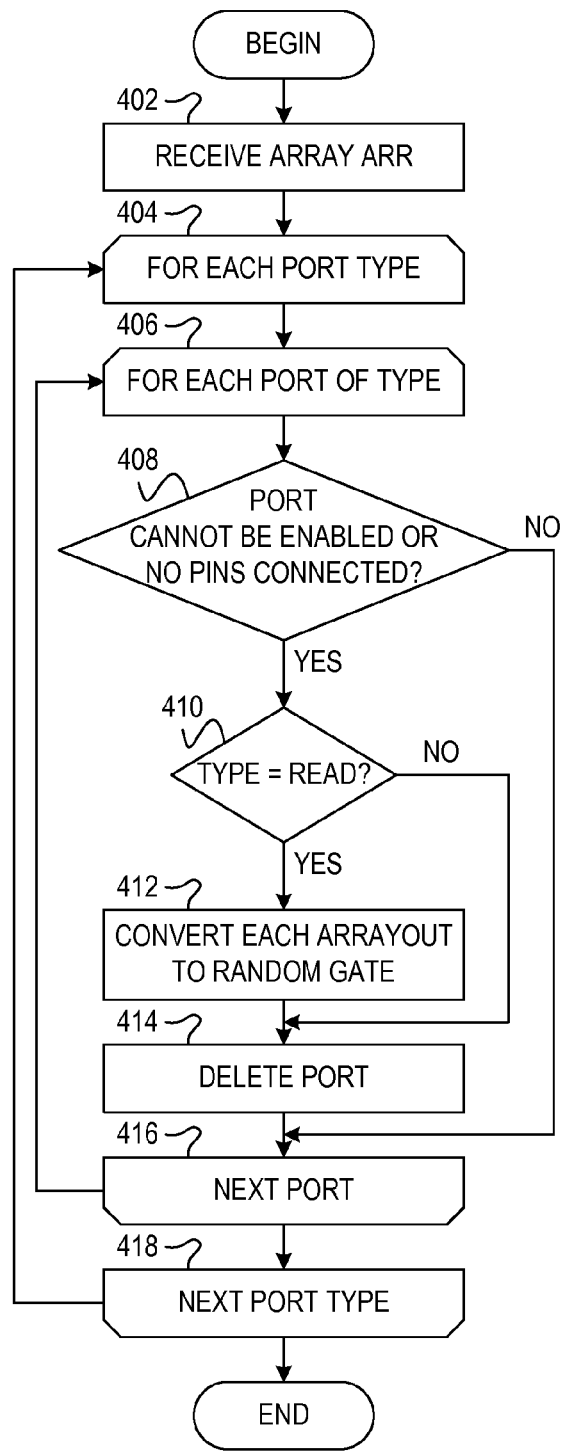

*FIG. 7*

```
void coalesce_ports_by_address(array arr) {
 for each port type T in (Read, Init, Write)
   for each port T_i in (T_n, ..., T_1) in order of increasing precedence
     for each j>i
       if((T_i.address(0 to p) == T_j.address(0 to p)) AND
         ((T_i.enable implies T_j.enable) OR // T_j would be overwritten by T_i
         (T == Read) OR
         (for all k such that j>k>i, (T_j.enable implies NOT T_k.enable) OR (T_j.address(0 to p) !=
T_k.address(0 to p)))))

if(T == Read)
           for each column l
             if(T_j.data(l) is not connected) continue
             if(T_i.data(l) is not connected) move T_j.data(l) to T_i.data(l)
             else
               if(T_i.enable implies T_j.enable)
                 merge T_j.data(l) onto T_i.data(l)

else if(T_j.enable implies T_i.enable)
                 merge T_i.data(l) onto T_j.data(l)

else
                 if(R_T_i has not been created for another strand of this port)
                   create read port R_T_i
                   R_T_i.enable = T_i.enable OR T_j.enable
                   R_T_i.address(0 to p) = T_i.address(0 to p)

create a fresh arrayout for R_T_i.data(l)
                 merge T_j.data(l) onto R_T_i.data(l)
                 merge T_i.data(l) onto R_T_i.data(l)

else
           if no strand of T_j.data(0 to q) is connected which is disconnected for T_i.data(0 to q)
             for each column l
               if(T_i.data(l) is connected)
                 if(T_j.data(l) is connected)
                   T_i.data(l) = if(T_j.enable) then (T_j.data(l)) else (T_i.data(l))
                   disconnect T_j.data(l)
             T_i.enable = T_i.enable OR T_j.enable
}
```

*FIG. 9*

```
void coalesce_ports_by_enable(array arr) {
 for each port type T in (Read, Init, Write)
   for each port T_i in (T_n, ..., T_1) in order of decreasing precedence
     for each j>i
       if((T_i.enable AND T_j.enable) == 0)
         T_i.address(0 to p) = if(T_i.enable) then (T_i.address(0 to p)) else (T_j.address(0 to p))
       if(T != Read)
         if(for all k such that j>k>I, (T_j.enable implies NOT T_k.enable) OR (T_j.address(0 to p) != T_k.address(0 to p)))
           T_i.address(0 to p) = if(T_i.enable) then (T_i.address(0 to p)) else (T_j.address(0 to p))
           T_i.data(0 to q) = if(T_i.enable) then (T_i.data(0 to q)) else (T_j.data(0 to q))
           T_j.enable = T_j.enable OR T_i.enable
       else //Synthesize Read port
         create read port R_T_i
         R_T_i.enable = T_i.enable OR T_j.enable
         R_T_i.address(0 to p) = if(T_i.enable) then (T_i.address(0 to p)) else (T_j.address(0 to p))

for each colulmn l
           create a fresh arrayout for R_T_i.data(l)
           if(T_j.data(l) is connected) merge T_j.data(l) onto R_T_i.data(l)
           if(T_i.data(l) is connected) merge T_i.data(l) onto R_T_i.data(l)

delete port T_i
}
```

*FIG. 11*

```
void coalesce_arrayouts(array arr) {
 for each Read port R_i
   identify mask M for which all connected arrayouts of port R_i are masked with respect to some
fanout boundary store R_i.M for each pair of Read ports R_i, R_j
   if((NOT(R_i.M) AND NOT(R_j.M)) == 0)
      merge read ports using "Synthesize Read port"
}
```

*FIG. 13*

```
void tie_read_enables(array arr) {
 for each Read port R_i
   identify mask M for which all connected arrayouts of port R_i are masked with respect to some
fanout boundary simplify R_i.enable using NOT(M) as a don't care condition
}
```

*FIG. 15*

```
void bypass_array(array arr) {
 if(arr.type != write-before-read) return for each Read port type R_i (R_1, ..., R_n)
   if there exists a write port W_j such that ((R_i.enable implies W_j.enable) and
    (R_i.enable implies (W_j.address(0 to p) == R_i.address(0 to p))))

for each column l
       if(W_j.data(l) is not connected) continue
       merge R_i.data(l) onto W_j.data(l)
}
```

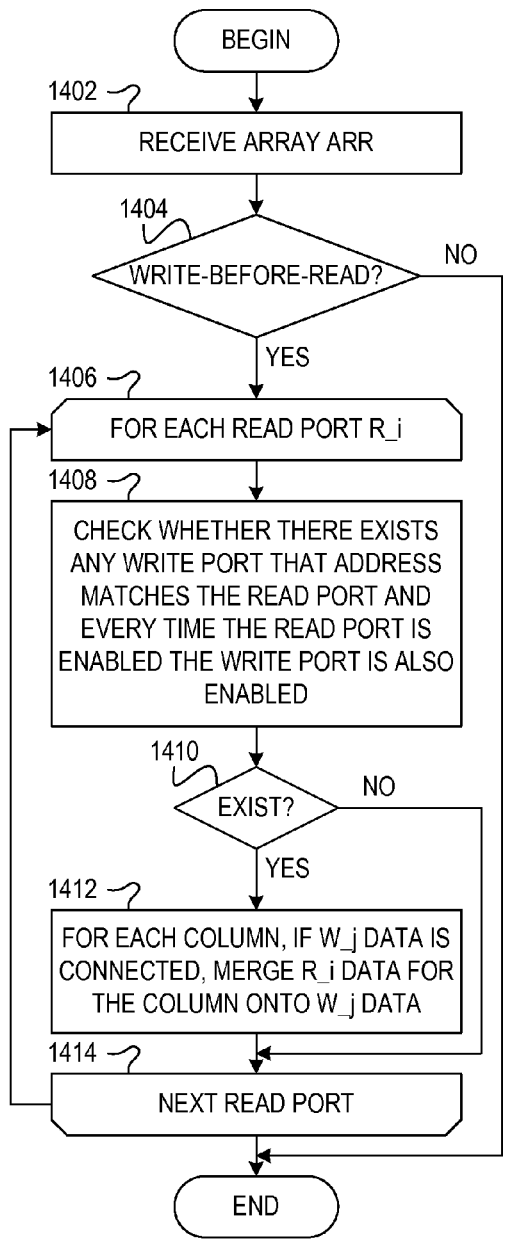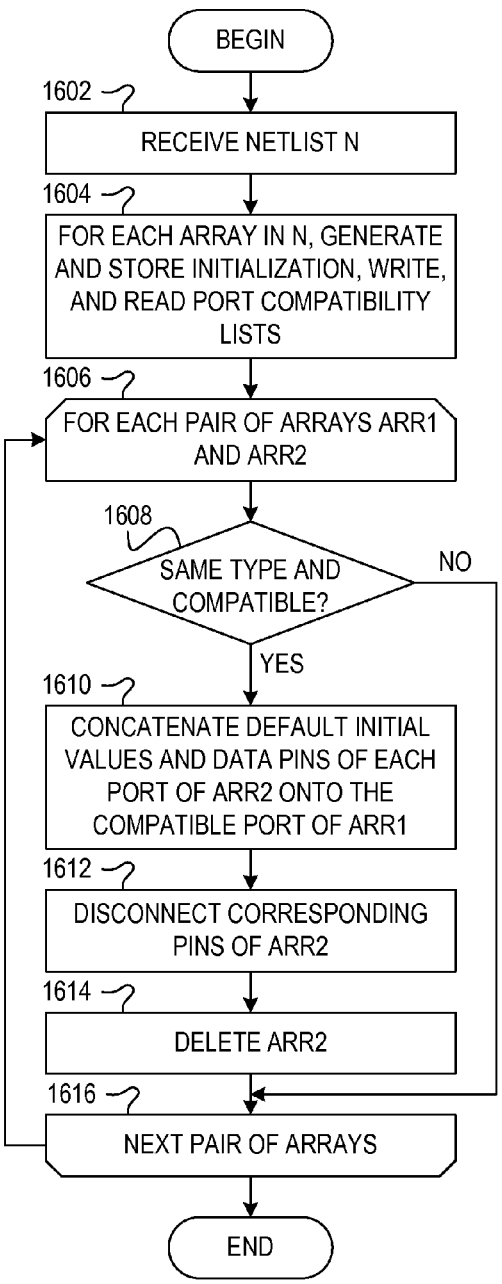

FIG. 17

```
void concatenate_arrays(netlist N) {
 for each array "arr" in N
  form a compatibility signature over address and enable pins for all ports as follows:
    I_list = generate_compatibility_list(arr, Init)
    W_list = generate_compatibility_list(arr, Write)
    R_list = generate_compatibility_list(arr, Read)
    store arr.<I_list, W_list, R_list> for each pair of arrays arr1, arr2
    if (arr1.type == arr2.type) AND (arr1.I_list is compatible with arr2.I_list) AND
      (arr1.W_list is compatible with arr2.W_list) AND (arr1.R_list is compatible with arr2.R_list)

concatenate the default initial values and data pins of each port of arr2 onto the compatible port
of arr1, disconnecting these pins of arr2 delete arr2
}

//note: T is either Init, Write, or Read
list generate_compatibility_list(array arr, port_type T) {
 list = NULL;
 for port T_i in (T_1, ..., T_n) in order of decreasing precedence updates_i = (T_i.enable AND (there is no port T_h for h<i for which T_i.address(0 to p) ==
T_h.address(0 to p)));

push list, <updates_i, T_i.address(0 to p)> return list
}
```

FIG. 23

```
void migrate_read_ports(netlist N) {
 for each array "arr" in N
  if arr has no Read ports or has no columns or has #rows = 0
    delete arr
}
```

*FIG. 19A*

```
void migrate_read_ports(netlist N) {
 for each array "arr" in N
  form a compatibility signature over address and enable pins for all ports as follows:

I_list = generate_obligation_list(arr, Init)
   W_list = generate_obligation_list(arr, Write)

store arr.<I_list, W_list> for each pair of arrays arr1, arr2
   if (arr1.type == arr2.type) AND (default initial values of arr1 are compatible with default initial
values of arr2) AND
     compatible_lists(arr1.I_list, arr2.I_list) AND
     compatible_lists(arr1.W_list, arr2.W_list)

migrate all Read ports from arr2 to arr1 delete arr2
}
bool compatible_lists(list I_i, list I_j) {
 for each <updates_m, address_m, data_m> in (I_i)
  if(updates_m == TRUE) { check if exists <updates_n, address_n, data_n> in I_j such that
     <updates_n == TRUE, address_n(0 to p) == address_m(0 to p), data_n == data_m> if not, return false if exists <updates_n, address_n, data_n> in I_j such that (updates_n == TRUE) and this entry
    was not matched in above loop, return false return true
}
```

*FIG. 19B*

```
//note: T is either Init or Write
list generate_obligation_list(arrayout a, port_type T) {
 list = NULL;
 for port T_i in (T_1, ..., T_n) of a.array in order of decreasing precedence updates_i = FALSE if T_i.data(a.column) is disconnected else
        (a_i.port.enable AND (there is no port T_h for h<i for which T_h.data(a.column) is connected
        and T_i.address(0 to p) == T_h.address(0 to p)));

push list, <updates_i, T_i.address(0 to p), T_i.data(a.column)> return list
}
```

*FIG. 21B*

```
 else if(mode == lesser_than)
  set #rows for arr = 2^new_bits else
  set #rows for arr = new_rows for each address pin l in (0, ..., p) // most- to least-significant
  if every Read port R_i has address pin l equivalent to the same constant c_l
   for each Read, Write, and Init port T_i
    shrink T_i.address(0, p-1) = T_i.address(0, ..., l-1, l+1, ..., p)

for each Write and Init port T_i
    T_i.enable = T_i.enable AND (T_i.address(l) == c_l)

decrement p
}
```

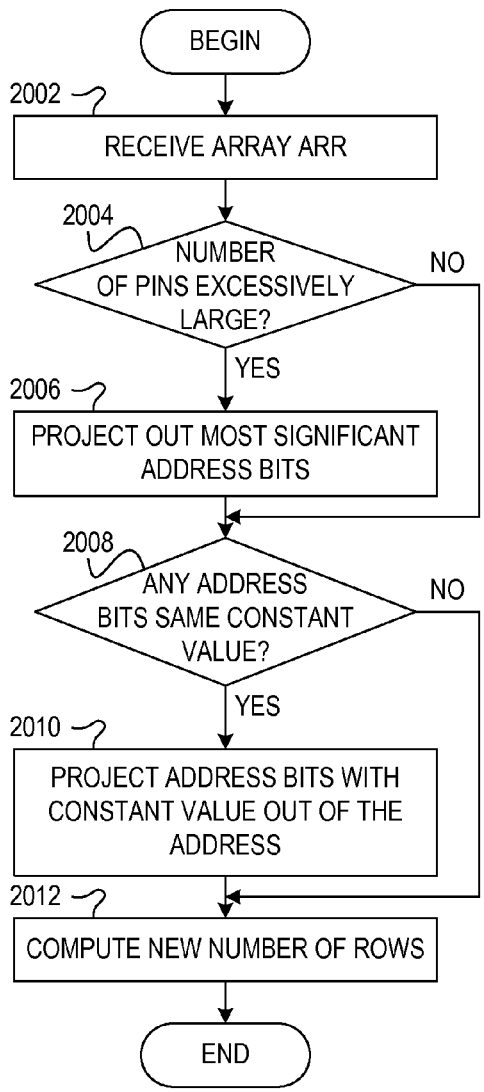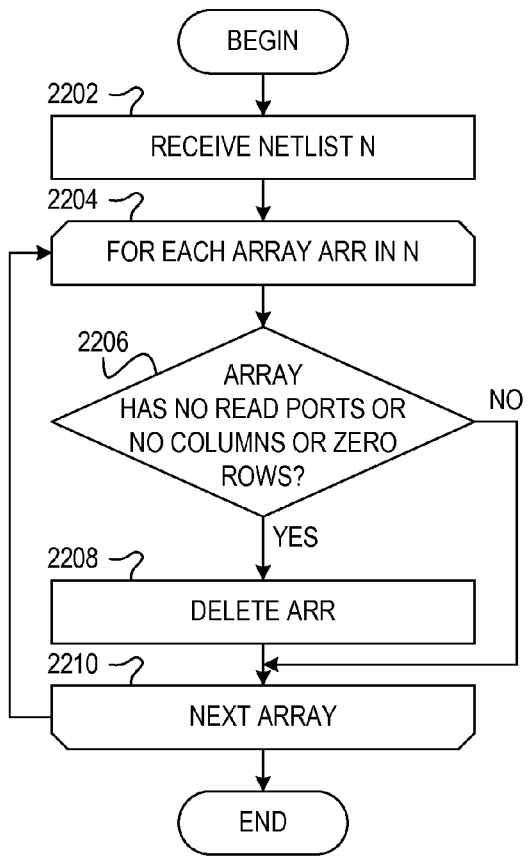

*FIG. 21A*

```
void reduce_address(array arr) {
  while(#rows of arr < 2^p, where p is one less than the number of address pins of arr)
    for each Read, Write, and Init port T_i of arr
      T_i.enable = T_i.enable AND NOT(T_i.address(0))
      shrink T_i.address(0 to p-1) = T_i.address(1 to p)

decrement p mode = equal_to
  mask_k = 1
  new_bits = 0;
  new_rows = #rows; // note: this is the smallest out-of-bound address, since in-bound are 0..#rows-1
  for each address pin l in (p, ..., 0) // least- to most-significant
    if every Read port R_i has address pin l equivalent to the same constant c_l in (0,1)
      if((c_l==1) AND (#rows has l'th bit set)) // no action here
      else if(c_l==1)
        mode = greater_than
        new_rows = 0
      else
        mode = lesser_than
        new_rows = 0
      continue new_bits++;
    if NOT(#rows has l'th bit set)
      if(mode == greater_than)
        continue // stay greater_than
      else
        new_rows += mask_k
        if(mode == lesser_than)
          continue // stay lesser_than mode = equal_to
      mask_k <<= 1
      continue if(mode == greater_than)
      set #rows for arr = 0
```

US 8,336,016 B2

ELIMINATING, COALESCING, OR BYPASSING PORTS IN MEMORY ARRAY REPRESENTATIONS

BACKGROUND

The present application relates generally to an improved data processing apparatus and method and more specifically to mechanisms for eliminating, coalescing, or bypassing ports in memory array representations.

Logic designs used to represent hardware, software, or hybrid systems may be represented using a variety of formats. Example formats include hardware description languages (HDLs), higher-level languages such as SystemC, or lower-level formats such as netlists. There are numerous application domains in which it is advantageous to reduce the size of design representations. For example, logic synthesis and design aids often attempt to yield more compact representations that lend themselves to higher quality silicon or assembly code.

There are numerous application domains in which it is advantageous to reduce the size of memory array representations. For example, logic synthesis often attempts to yield more compact representations that lend themselves to higher-quality silicon or assembly code. Smaller array representations may directly factor into this goal, particularly for increasingly common intellectual property reuse and migration integrated circuit flows for which some aspects of a design may be irrelevant.

Decreasing the size of memory arrays also indirectly helps synthesis flows through helping simulation and verification flows, in that synthesis often requires the use of such algorithms during its processing. In particular, logic simulators often face substantial performance overheads in evaluating array ports, requiring hash table accesses to represent the contents of large arrays.

Hardware accelerators often have limitations on the number of arrays, and read/write port connectivity, that may be supported. Reducing array size may be mandatory to enable the application of acceleration. Formal verification techniques are often very sensitive to the size and number of ports. For example, techniques to use satisfiability solvers to analyze the behavior of arrays over time often directly compare the read address of each read port for a given time frame to the write address of every write port for every prior time frame. Such modeling entails quadratic complexity with respect to the number of read and write ports.

SUMMARY

In one illustrative embodiment, a method, in a data processing system, is provided for minimizing memory array representations. The method comprises receiving, in the data processing system, an integrated circuit design having a memory array. The method further comprises reducing, by the data processing system, a number of ports in the memory array in the integrated circuit design to form a reduced integrated circuit design. The method further comprises performing, by the data processing system, synthesis or verification on the reduced integrated circuit design.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 1 is a block diagram illustrating an example design environment in accordance with an illustrative embodiment;

FIG. 2 is a flowchart illustrating operation of a mechanism for eliminating redundant columns in a memory array in accordance with an illustrative embodiment;

FIG. 3 depicts example pseudo-code for the operations illustrated in FIG. 2 in accordance with an illustrative embodiment;

FIG. 4 is a flowchart illustrating operation of a mechanism for eliminating redundant ports in a memory array in accordance with an illustrative embodiment;

FIG. 5 depicts example pseudo-code for the operations illustrated in FIG. 4 in accordance with an illustrative embodiment;

FIG. 7 depicts example pseudo-code for the operations illustrated in FIGS. 6A and 6B in accordance with an illustrative embodiment;

FIG. 9 depicts example pseudo-code for the operations illustrated in FIG. 8 in accordance with an illustrative embodiment;

FIG. 11 depicts example pseudo-code for the operations illustrated in FIG. 10 in accordance with an illustrative embodiment;

FIG. 13 depicts example pseudo-code for the operations illustrated in FIG. 12 in accordance with an illustrative embodiment;

FIG. 14 is a flowchart illustrating operation of a mechanism for bypassing write-before-read ports in a memory array in accordance with an illustrative embodiment;

FIG. 15 depicts example pseudo-code for the operations illustrated in FIG. 14 in accordance with an illustrative embodiment;

FIG. 16 is a flowchart illustrating operation of a mechanism for concatenation of memory arrays in accordance with an illustrative embodiment;

FIG. 17 depicts example pseudo-code for the operations illustrated in FIG. 16 in accordance with an illustrative embodiment;

FIGS. 19A and 19B depict example pseudo-code for the operations illustrated in FIG. 18 in accordance with an illustrative embodiment;

FIG. 20 is a flowchart illustrating operation of a mechanism to minimize address bits in a memory array in accordance with an illustrative embodiment;

FIGS. 21A and 21B depict example pseudo-code for the operations illustrated in FIG. 20 in accordance with an illustrative embodiment;

FIG. 22 is a flowchart illustrating operation of a mechanism for array deletion in accordance with an illustrative embodiment;

FIG. 23 depicts example pseudo-code for the operations illustrated in FIG. 22 in accordance with an illustrative embodiment;

DETAILED DESCRIPTION

Figure 6A:
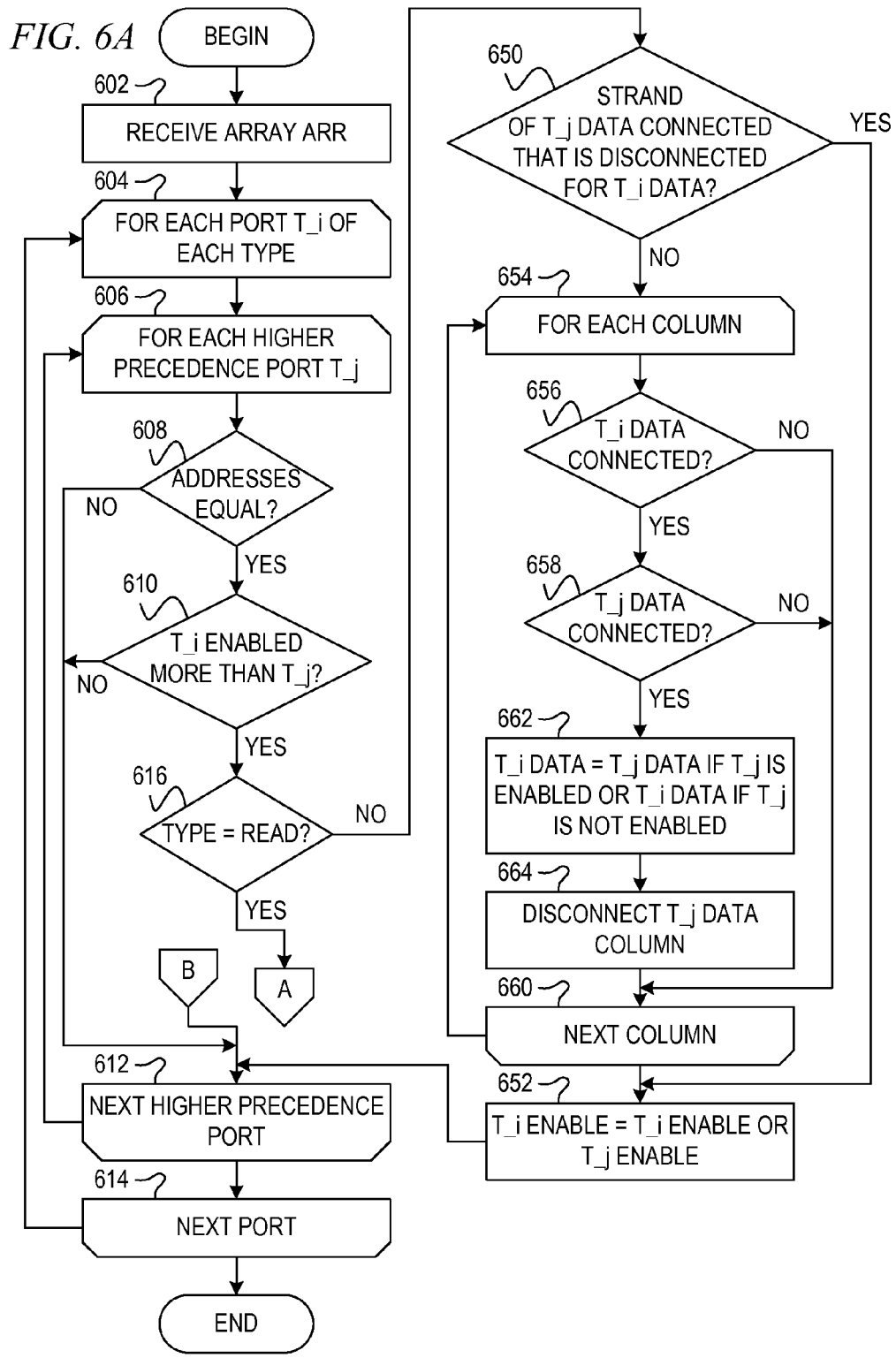
FIGS. 6A and 6B are flowcharts illustrating operation of a mechanism for coalescing ports by equivalent address in a memory array in accordance with an illustrative embodiment.

The illustrative embodiments provide mechanisms in a design environment for minimizing memory array representations for enhanced synthesis and verification. In one embodiment, the design environment comprises a mechanism to compress the width of arrays using disconnected pin information. In another embodiment, the design environment comprises a mechanism to simplify the enable conditions of array ports using "don't care" computations. In yet another embodiment, the design environment comprises a mechanism to reduce address pins from an array through analysis of limitations of readable addresses.

The illustrative embodiments provide mechanisms in a design environment for eliminating, coalescing, or bypassing ports. In one embodiment, the design environment comprises a mechanism to eliminate unnecessary ports in arrays using disabled and disconnected pin information. In another embodiment, the design environment comprises a mechanism to combine and reduce the number of array ports using address comparisons. In another embodiment, the design environment comprises a mechanism to combine and reduce the number of array ports using disjoint enable comparisons. In yet another embodiment, the design environment comprises a mechanism to combine and reduce the number of array ports using "don't care" computations. In another embodiment, the design environment comprises a mechanism to reduce the number of array ports through bypassing write-to-read paths around arrays.

The illustrative embodiments also provide mechanisms in a design environment for array concatenation. In one embodiment, the design environment comprises a mechanism to concatenate arrays with enable- and address-compatible ports, thereby reducing the number of arrays in a netlist. In another embodiment, the design environment comprises a mechanism to migrate read ports from one array to another based upon compatible enable-, address-, and data-compatible write ports, thereby reducing the number of arrays in a netlist. In yet another embodiment, the design environment comprises a mechanism to eliminate unnecessary arrays.

FIG. 1 is a block diagram illustrating an example design environment in accordance with an illustrative embodiment. When designing an integrated circuit, a designer may first write a high-level description of the circuit in a hardware description language (HDL), such as Very High-Speed Integrated Circuit (VHSIC) Hardware Description Language (VHDL) or Verilog. In electronics, a hardware description language may be any language from a class of computer languages and/or programming languages for formal description of electronic circuits, and more specifically, digital logic. A HDL can describe the operation of a circuit, its design and organization, and tests to verify its operation by means of simulation. Most designs begin as a set of requirements or a high-level architectural diagram. The designer often prototype control and decision structures in flowchart applications or enter them in a state-diagram editor. The process of writing the HDL description is highly dependent on the nature of the circuit and the designer's preference for coding style.

Design environment 110 may include editing tool 112, simulation tool 114, verification tool 116, and graphical user interface (GUI) 118. A circuit designer may create and edit an integrated circuit (IC) design, which may be written in a high-level HDL, such as VHSIC or Verilog, and store the IC design in design storage 102. The circuit designer may interact with editing tool 112 via graphical user interface (GUI) 118 using input device 122 and output device 124.

Simulation tool 114 simulates operation of an IC circuit from design storage 102. The designer may control simulation tool 114 via GUI 118 using input device 122 and output device 124. Simulation tool 114 stores trace results in trace storage 104. Simulation tool 114 is a primary tool for verifying the logical correctness of a design. In many cases logic simulation is the first activity performed in the process of taking a hardware design from concept to realization. Modern hardware description languages are both simulatable and synthesizable.

Simulation is a natural way for the designer to get feedback about a design. Because simulation tool 114 executes as a program, the designer interacts with the simulation using the vocabulary and abstractions of the design. There is no layer of translation to obscure the behavior of the design. The level of effort required to debug and then verify the design is proportional to the maturity of the design. That is, early in the life of the design, the designer may find bugs and incorrect behavior quickly. Simulation is completely general; any hardware design can be simulated. The only limits are time and computer resources in design environment 110.

Verification tool 116 allows the designer to verify an IC design from design storage 102. A manufacturer may establish and maintain procedures for verifying an IC design. Design verification confirms that the design output meets the design input requirements. Verification tool 116 compares design outputs to design input requirements to determine whether the requirements have been met. The designer may control verification tool 116 via GUI 118 using input device 122 and output device 124. Formal and semiformal verification techniques are powerful tools for the construction of correct logic designs. They have the power to expose even the most probabilistically uncommon scenario that may result in a functional design failure, and ultimately have the power to prove that the design is correct, i.e. that no failing scenario exists.

A netlist contains a directed graph with vertices representing gates and edges representing interconnections between those gates. The gates have associated functions, such as constants, primary inputs (hereafter referred to as RANDOM gates), combinational logic such as AND gates, simple sequential elements (hereafter referred to as registers), and memory arrays. Registers have two associated components: their next-state functions and their initial-value functions. The netlist represents both components as other gates in the graph. Semantically, for a given register, the value appearing at its initial-value gate at time "0" ("initialization" or "reset" time) is applied as the value of the register itself; the value appearing at its next-state function at time "i" is applied to the register itself at time "i+1".

Memory arrays represent two-dimensional grids of registers, referred to as "cells," arranged as rows vs. columns. A circuit reads or writes the contents of memory arrays via dedicated "ports" of three types: read ports, initialization ports, and write ports. Ports of these three types have three components: an address, a data vector, and an enable. The address indicates which row is to be accessed. The enable indicates whether or not the given port is being accessed. The data vector indicates what value is to be written to the given row (if enabled) in the case of a write port or the contents present for the given row of an enabled read. Initialization ports are specialized write ports that are relevant only at time 0.

Memory arrays have a pre-defined number of rows and columns, a default initial value (in case of an unwritten row is read), and an indication of read-before-write vs. write-before-read behavior. The latter is relevant in case of a concurrent read and write to the same address: read-before-write will not return the concurrent write data, whereas write-before-read will. The memory array will often conservatively randomize data contents of a read port in case the read enable is not active, or in case the read row is "out-of-bounds," i.e. the read address is larger than the pre-defined number of rows for the array. Read port data pins are the only "outputs" of arrays. All other pins are "inputs." Read port data pins are sometimes referred to as "arrayouts."

Write ports and initialization ports have a pre-defined precedence defining which values will persist in case of multiple concurrent writes or initializations to the same address. Port precedence is irrelevant for read ports; every concurrent read to a given address returns the same data, which is the highest-priority write to the given address in the case of write-before-read, else the highest-priority most recent write to that address if any exist, else the highest-priority initialization to that address if any such initialization ports exist, else the default initial value.

Certain gates in a netlist are labeled as "targets." Targets correlate to the properties one wishes to verify; the goal of the verification process is to find a way to drive a "1" to a target node (and to generate a "trace" illustrating this scenario if one is found), or to prove that no such assertion of the target is possible.

To establish a convention for referring to components of an array, let $R\_1, \ldots, R\_m$ represent the read ports, $W\_1, \ldots, W\_n$ represent the write ports in order of decreasing precedence, and let $I\_1, \ldots, I\_o$ represent the initialization ports in order of decreasing precedence. For a given port $P\_i$, where P may be R, W, or I), let $P\_i$ enable refer to the gate that is connected to the enable pin of that port, $P\_i.address(0), \ldots, P\_i.address(p)$ represent the gates connected to the address pins of that port with 0 being the most significant bit, and $P\_i.data(0), \ldots, P\_i.data(q)$ be the gates connected to the data pins of that port. It is possible for some data pins to be disconnected from the ports; for read ports, this means that the corresponding column bit is not relevant to the netlist, whereas for write and initialization ports, this means that the corresponding column bit is not updated by a corresponding write or initialization operation. For a given arrayout $a\_i$, let $a\_i.array$ represent the array to which $a\_i$ is associated, let $a\_i.port$ represent the port to which that arrayout is connected, and let $a\_i.column$ represent the column of the array it samples. In other words, $a\_i.port.data(a\_i)$ column=$a\_i$. The write-before-read attribute of an array is referred to as array.type.

The illustrative embodiments use a variety of transformations to reduce the size of array representations themselves. These transformations are useful to enhance a variety of applications. It is noteworthy that these transformations are furthermore enhanced by, and enhance, the effectiveness of other transformations. For example, applying these transformations to a netlist that has been reduced by other techniques may enable even greater reductions of these array-simplification transformations. Additionally, the netlist resulting from these array-simplifying transformations may enable greater reductions through other techniques.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

FIG. 2 is a flowchart illustrating operation of a mechanism for eliminating redundant columns in a memory array in accordance with an illustrative embodiment. Operation begins, and the mechanism receives a memory array, arr (block 202). For each column in the array (block 204), the mechanism checks for a read port in the array that has the column connected (block 206), and the mechanism determines whether array has a read port that has the column connected (block 208). If not, the mechanism compresses the column out of the array by projecting that column out of the data pins of each port (block 210). Thereafter, or if the mechanism determines that the array does have a read port that has the column connected in block 208, the mechanism considers the next column (block 212), and returns to block 204 to repeat the loop for the next column. If the mechanism has considered the last column in block 212, then operation ends.

FIG. 3 depicts example pseudo-code for the operations illustrated in FIG. 2 in accordance with an illustrative embodiment. The mechanism reduces the width of arrays by eliminating columns that cannot be read. Such conditions may arise under a variety of conditions. For example, some arrays may not be referenced down to column 0, e.g., referencing only range 2 to 4. This transformation compresses an otherwise five-column wide array down to three bits. Furthermore, some properties may only rely upon reading a subset of an array's columns, allowing a related compression. Additionally, through other reduction techniques, the design environment may merge some arrayouts, enabling the corresponding column to be eliminated.

FIG. 4 is a flowchart illustrating operation of a mechanism for eliminating redundant ports in a memory array in accordance with an illustrative embodiment. Operation begins, and the mechanism receives an array, arr (block 402). For each port type (block 404) and for each port of a given type (block 406), the mechanism determines whether the port can be enabled (block 408). If the port can never be enabled, the mechanism determines whether the port is a read port (block 410). If the port is a read port, the mechanism converts each arrayout to a RANDOM gate (block 412). Thereafter, or if the mechanism determines that the port is not a read port in block 410, the mechanism deletes the port (block 414). Thereafter, or if the port can be enabled in block 408, the mechanism considers the next port (block 416), and returns to block 406 to repeat the loop for the next port. If the mechanism has considered the last port in block 416, then the mechanism considers the next port type (block 418), and returns to block 404 to repeat the loop for the next port type. If the mechanism has considered the last port type in block 418, then operation ends.

FIG. 5 depicts example pseudo-code for the operations illustrated in FIG. 4 in accordance with an illustrative embodiment. The mechanism eliminates redundant ports that either can never be enabled or are disconnected. This mechanism is particularly useful in combination with other transformations that collectively eliminate pin connections in arrays.

Figure 6B:
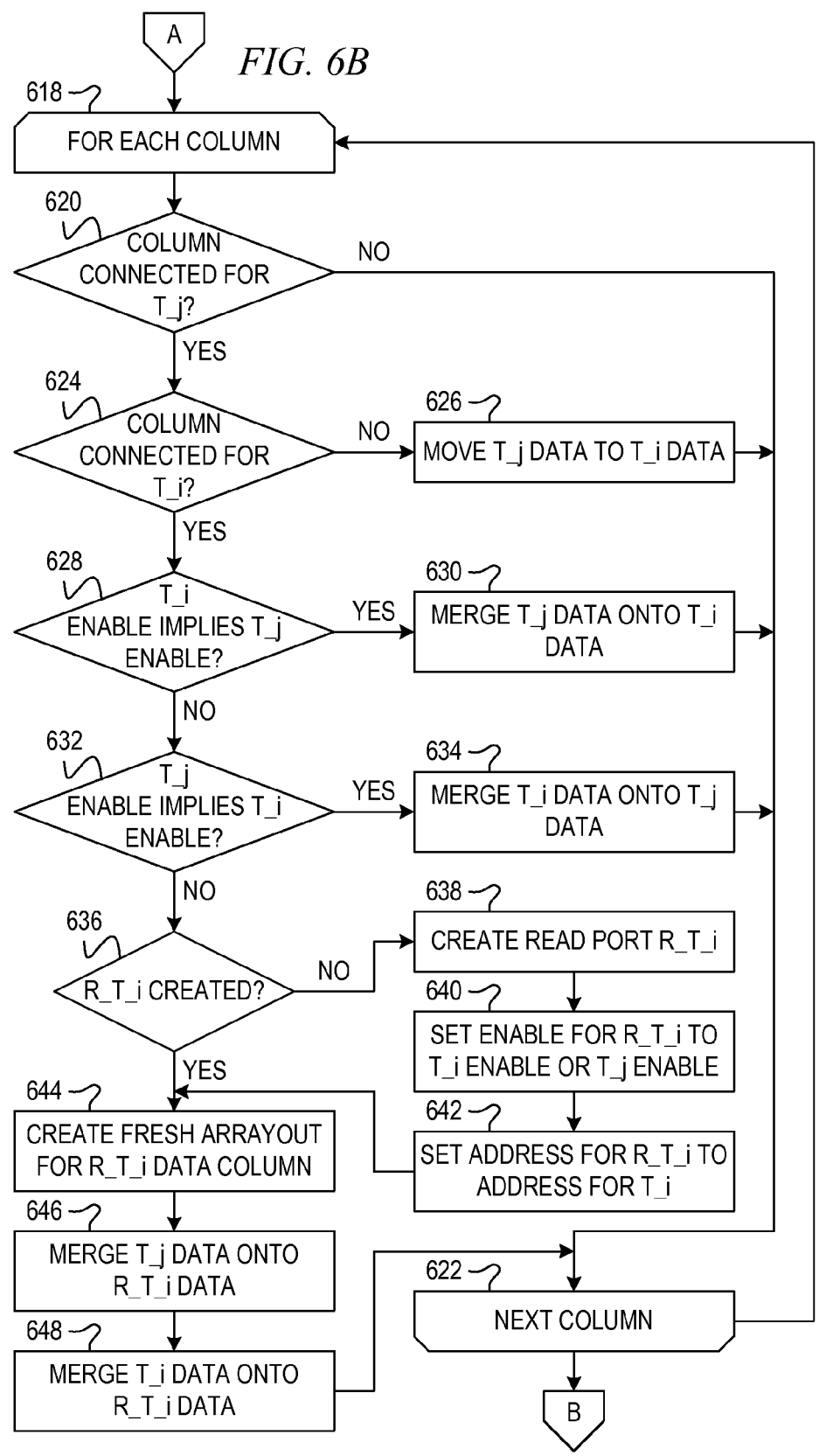

FIGS. 6A and 6B are flowcharts illustrating operation of a mechanism for coalescing ports by equivalent address in a memory array in accordance with an illustrative embodiment. Operation begins, and the mechanism receives an array, an (block 602). For each port, T_i, of each port type (block 604) and for each higher precedence port, T_j (block 606), the mechanism determines whether T_i and T_j have equal addresses (block 608). If the mechanism determines that T_i and T_j have equal addresses, then the mechanism determines whether T_i is enabled no more frequently than T_j (block 610). For a write or init port, this indicates that T_j would overwrite T_i. More specifically, although not shown in FIG. 6A for simplicity, in block 610, the mechanism determines whether T_j overwrites T_i by determining whether T_i enable implies T_j enable OR the port type is read OR there is no intermediate port that may concurrently write to the same address as T_i. If T_j does not overwrite T_i, or if the addresses are not equal in block 608, then the mechanism considers the next higher precedent port (block 612), and returns to block 606 to repeat the loop for the next higher precedent port. If the mechanism has considered the last higher precedent port in block 612, then the mechanism considers the next port (block 614) and returns to block 604 to repeat the loop for the next port. If the mechanism has considered the last port in block 614, then operation ends.

Returning to block 610, if T_i is enabled more than T_j, the mechanism determines whether the port is a read port (block 616). If the port is a read port, then for each column in the read port (block 618 in FIG. 6B), the mechanism determines whether the column is connected for T_j (block 620). If the mechanism determines that the column is not connected for T_j, then the mechanism considers the next column for the read port (block 622) and returns to block 618 to repeat the loop for the next column.

If the mechanism determines that the column is connected for T_j in block 620), then the mechanism determines whether the column is connected for T_i (block 624). If the column is not connected for T_i, then the mechanism moves T_j data for the column to T_i data (block 626), and the mechanism considers the next column for the read port (block 622) and returns to block 618 to repeat the loop for the next column.

If the mechanism determines that the column is connected for T_i in block 624, then the mechanism determines whether T_i enable implies T_j enable, meaning when T_i enable is asserted, then T_j enable is also asserted (block 628). If T_i enable implies T_j enable, then the mechanism merges T_j data onto T_i data for the column (block 630), and the mechanism considers the next column for the read port (block 622) and returns to block 618 to repeat the loop for the next column.

If the mechanism determines that T_i enable does not imply T_j enable in block 628, then the mechanism determines whether T_j enable implies T_i enable (block 632). If T_j enable implies T_i enable, then the mechanism merges T_i data onto T_j data for the column (block 634), and the mechanism considers the next column for the read port (block 622), and returns to block 618 to repeat the loop for the next column.

If the mechanism determines that T_j enable does not imply T_i enable in block 632, then the mechanism determines whether a read port, R_T_i, has been synthesized (block 636). If a read port has not been synthesized, the mechanism creates a read port R_T_i (block 638), sets the enable for R_T_i to T_i enable OR T_j enable (block 640), and sets the address for R_T_i to the address for T_i (block 642). Thereafter, or if R_T_i has been created in block 636, the mechanism creates a fresh arrayout for R_T_i data for the given column (block 644). Then, the mechanism merges T_j data onto R T_i data for the column (block 646) and merges T_i data onto R_T_i data for the column (block 648). Thereafter, the mechanism considers the next column for the read port (block 622), and returns to block 618 to repeat the loop for the next column.

If the mechanism has considered the last column in block 622, then the mechanism proceeds to block 612 to consider the next higher precedence port and repeat the loop.

Returning to block 616, if the port is a non-read port, the mechanism determines whether a strand of T_j data is connected that is disconnected for T_i data (block 650). If there is a strand of T_j data that is connected that is disconnected for T_i data, then the mechanism sets T_i enable equal to T_i enable OR T_j enable (block 652). Then, the mechanism considers the next higher precedence port (block 612) and returns to block 606 to repeat the loop for the next higher precedent port.

If the mechanism determines that no strand of T_j data is connected that is disconnected for T_i data in block 650, for each column (block 654), the mechanism determines whether T_i data is connected for the column (block 656). If T_i data is connected for the column, then the mechanism determines whether T_j data is connected (block 658). If T_j data is not connected for the column, or T_i data is not connected for the column in block 656, then the mechanism considers the next column (block 660) and returns to block 654 to repeat the loop for the next column. If T_i data is connected for the given column in block 656 and T_j data is connected for the given column in block 658, then the mechanism sets T_i data for the column equal to T_j data for the column if T_j is enabled or T_i data for the column if T_j is not enabled (block 662). The mechanism then disconnects T_j data for the column (block 664). Thereafter, the mechanism considers the next column (block 660) and returns to block 654 to repeat the loop for the next column. If the mechanism has considered the last column in block 660, then the mechanism sets T_i enable equal to T_i enable OR T_j enable (block 652) and proceeds to block 612 to consider the next higher precedence port.

FIG. 7 depicts example pseudo-code for the operations illustrated in FIGS. 6A and 6B in accordance with an illustrative embodiment. This mechanism attempts to reduce the number of ports of an array by identifying ports that have equivalent addresses and are reducible considering port types and enables. For initialization and write ports, if a higher-precedence port is guaranteed to write the same address whenever a lower-precedence port is writing to that address, the mechanism may eliminate the lower-precedence. Alternatively, if the enables may be implied but the mechanism can determine that no intermediate port may concurrently write to the same address, the mechanism may use the higher-precedence port to subsume the lower-priority port through ORing the two write enables and using a multiplexor to select among the proper data. For read ports, if the enable of either equivalent address port is implied by the other, the mechanism may merge the implied port's arrayouts onto the other. Otherwise, the mechanism must create a new port that produces the proper data in either enable case (the OR of the two ports' enables; for simplicity, always reading is another possibility), and the mechanism may merge both existing ports' arrayouts onto the new port.

Figure 8:
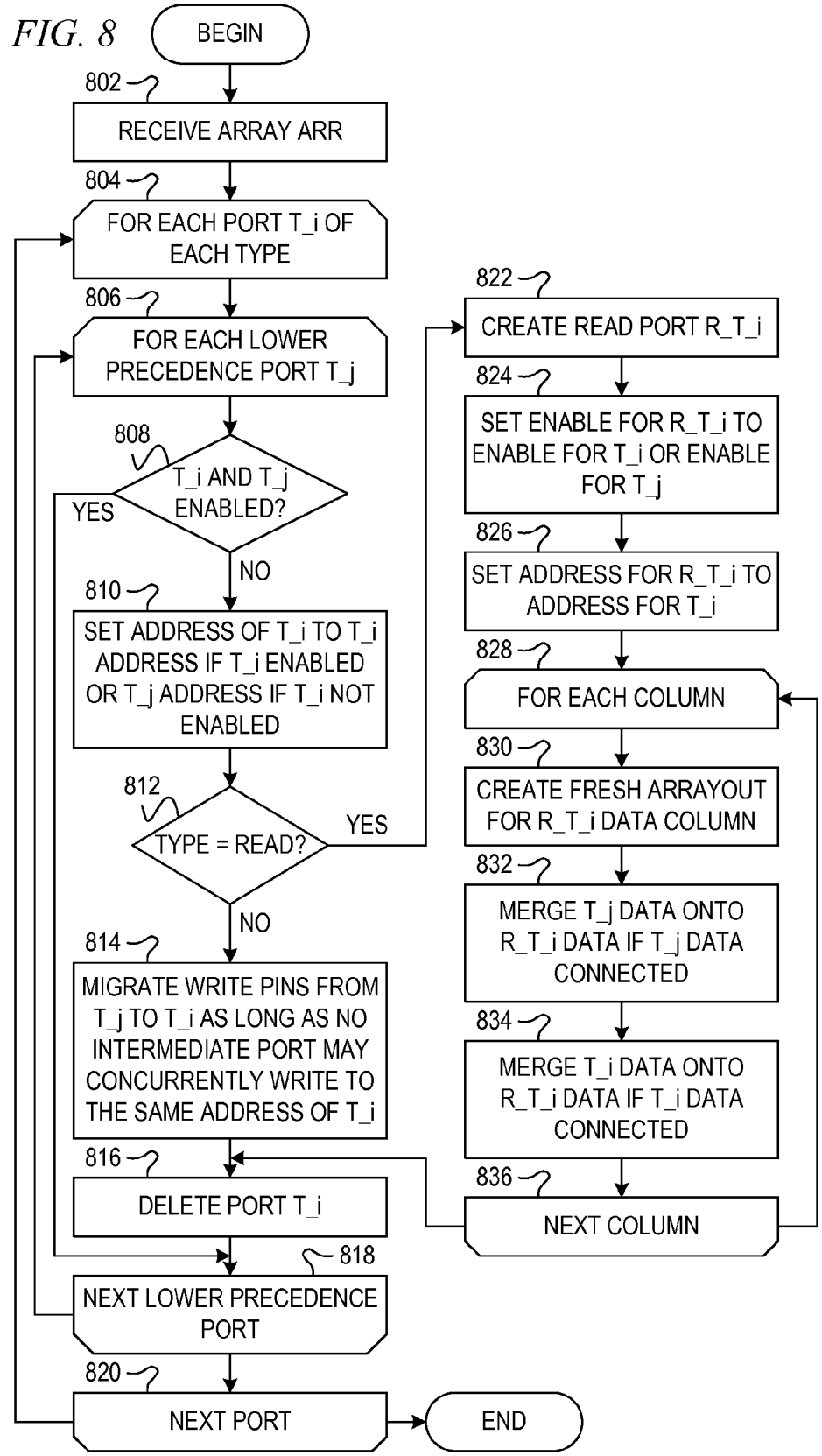
FIG. 8 is a flowchart illustrating operation of a mechanism for coalescing ports by orthogonal enable for a memory array in accordance with an illustrative embodiment.

FIG. 8 is a flowchart illustrating operation of a mechanism for coalescing ports by orthogonal enable for a memory array in accordance with an illustrative embodiment. Operation begins, and receives an array, an (block 802). For each port, T_i, of each port type (block 804) and for each lower precedence port, T_j (block 806), the mechanism determines whether T_i and T_j are enabled (block 808). If T_i and T_j are both enabled, the mechanism considers the next lower precedence port (block 818) and returns to block 806 to repeat the loop for the next lower precedence port. If the mechanism has considered the last lower precedence port in block 818, then the mechanism considers the next port (block 820) and returns to block 804 to repeat the loop for the next port. If the mechanism has considered the last port in block 820, then operation ends.

Returning to block 808, if the mechanism determines that T_i and T_j are not both enabled, then the mechanism sets the address of T_i to the T_i address if T_i is enabled or to the T_j address if T_i is not enabled (block 810). Then, the mechanism determines whether the port is a read port (block 812). If the port is a non-read port, the mechanism migrates write pins from T_j to T_i as long as no intermediate port may concurrently write to the same address of T_i (block 814). Then, the mechanism deletes port T_i (block 816). Thereafter, the mechanism considers the next lower precedence port (block 818) and returns to block 806 to repeat the loop for the next lower precedence port.

Returning to block 812, if the port is a read port, then the mechanism creates a read port R_T_i (block 822), sets the enable for R_T_i to T_i enable OR T_j enable (block 824), and sets the address for R_T_i to the address for T_i (block 826). Thereafter, for each column (block 828), the mechanism creates a fresh arrayout for R_T_i data for the given column (block 830). Then, the mechanism merges T_j data onto R_T_i data for the column if T_j data for the column is connected (block 832) and merges T_i data onto R_T_i data for the column if T_i data for the column is connected (block 834). Thereafter, the mechanism considers the next column for the read port (block 836), and returns to block 828 to repeat the loop for the next column. If the mechanism has considered the last column in block 836, then operation proceeds to block 816 to delete port T_i.

FIG. 9 depicts example pseudo-code for the operations illustrated in FIG. 8 in accordance with an illustrative embodiment. This mechanism attempts to merge array ports, although unlike the mechanism of FIGS. 6A, 6B, and 7, which merges based upon equivalent addresses, this mechanism looks for orthogonal enables, meaning that the enable signals on two ports can never be asserted simultaneously. If two ports have orthogonal enables, at most one of the two ports needs to access the contents of the array at any point in time, hence the mechanism may merge the two ports.

For initialization and write ports, the mechanism migrates the write pins from a lower-precedence port T_j to a higher-precedence port T_i as long as no intermediate port may concurrently write to the same address of T_i. For read ports, similar to the mechanism of FIGS. 6A, 6B, and 7, the mechanism creates a fresh read port that reads the enabled address of the array and merges the existing ports onto the new read port. It is noteworthy that the mechanism may merge an arbitrarily large set of pair-wise disjoint-enable read ports onto the same new array port, as follows from repeated application of this pair-wise transformation.

Figure 10:
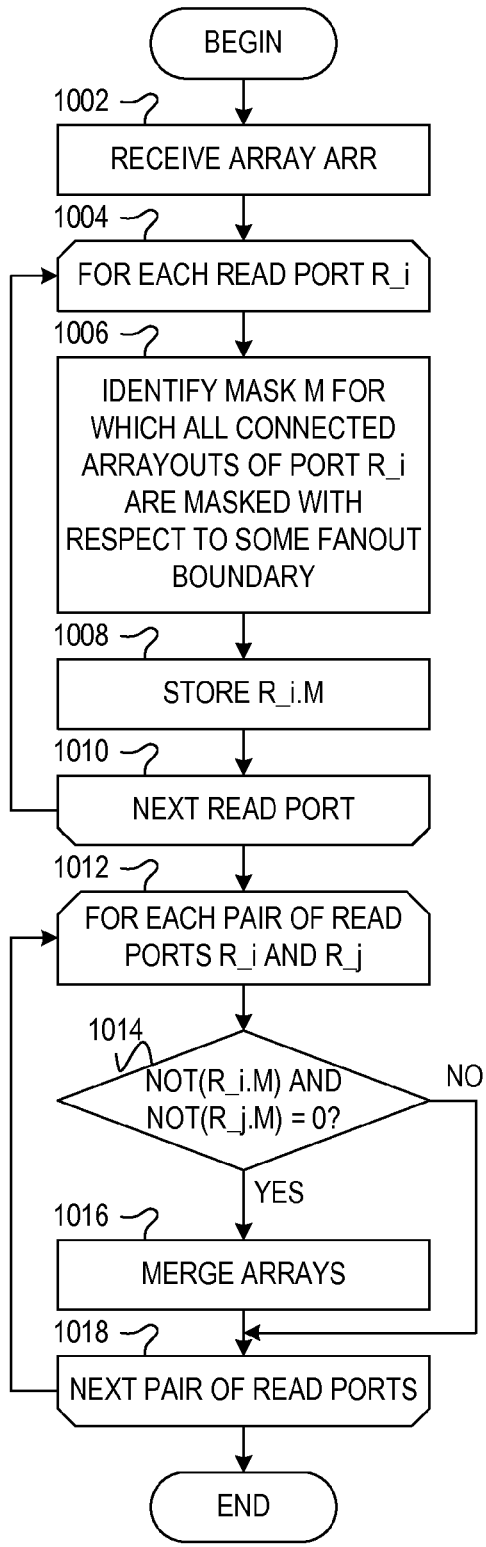
FIG. 10 is a flowchart illustrating operation of a mechanism for coalescing arrayouts due to "don't care" conditions in a memory array in accordance with an illustrative embodiment.

FIG. 10 is a flowchart illustrating operation of a mechanism for coalescing arrayouts due to "don't care" conditions in a memory array in accordance with an illustrative embodiment. Operation begins, and the mechanism receives an array, an (block 1002). For each read port R_i (block 1004), the mechanism identifies a mask, M, for which all connected arrayouts of port R_i are masked with respect to some fanout boundary (block 1006). The mechanism stores the mask, R_i.M (block 1008). Then, the mechanism considers the next read port (block 1010) and returns to block 1004 to repeat the loop for the next read port.

If the mechanism has considered the last read port in block 1010, then for each pair of read ports, R_i and R_j (block 1012), the mechanism determines whether the compliment of R_i.M AND the compliment of R_j.M is equivalent to zero (block 1014). If NOT(R_i.M) AND NOT(R_j.M) is equivalent to zero, then the mechanism merges the read ports (block 1016). In one example embodiment, the mechanism merges read ports using the synthesize read port technique described above with respect to blocks 822-836 in FIG. 8. Thereafter, or if NOT(R_i.M) AND NOT(R_j.M) is not equivalent to zero in block 1014, the mechanism considers the next pair of read ports (block 1018) and returns to block 1012 to repeat the loop for the next pair of read ports. If the mechanism has considered the last pair of read ports in block 1018, then operation ends.

FIG. 11 depicts example pseudo-code for the operations illustrated in FIG. 10 in accordance with an illustrative embodiment. This mechanism uses observability "don't care" conditions at arrayouts. An "observability don't care" condition is a condition for which a particular value—in this case, the value present at an arrayout—is not observable with respect to some fanout boundary. An example of such a condition is as follows: if every arrayout for a given port is ANDed with a particular gate g_i, the inverse of gate g_i represents an observability don't care condition because if NOT(g_i) holds, the value of those arrayouts cannot be witnessed by fanout logic.

Such observability don't care conditions may be computed using various techniques. One simple technique is merely to check for an AND condition at the output of arrayouts, consider the conjunction of terms aside from the arrayout itself as the inverse of the observability don't care condition, and take the condition M for the entire set of arrayouts as the conjunction of all such observability don't care conditions. Once computed, the mechanism can check pair-wise if these observability don't care conditions are orthogonal across ports and merge such ports accordingly. This is similar to the merging of read ports with orthogonal enables described with reference to FIGS. 8 and 9.

It is noteworthy again that the mechanism may merge an arbitrarily-large set of pair-wise disjoint observability don't care condition read ports onto the same new array port, as follows from repeated application of this pair-wise technique.

Figure 12:
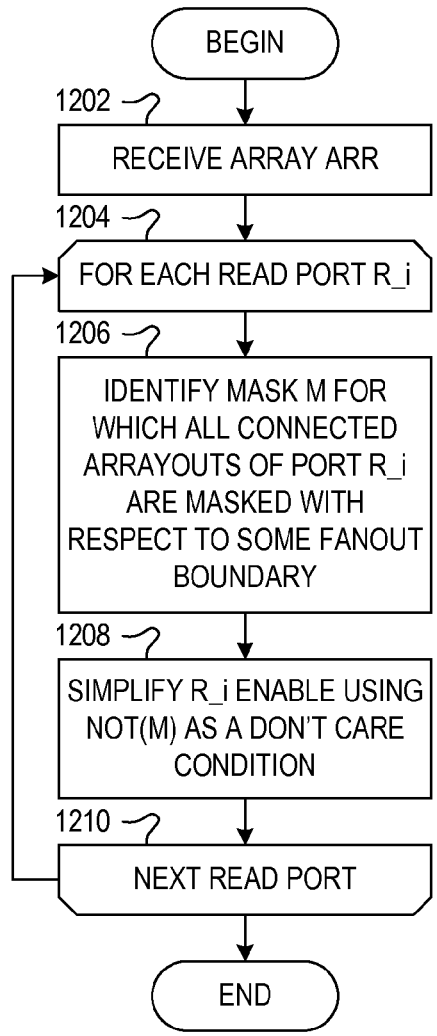
FIG. 12 is a flowchart illustrating operation of a mechanism to tie read enables for a memory array in accordance with an illustrative embodiment.

FIG. 12 is a flowchart illustrating operation of a mechanism to tie read enables for a memory array in accordance with an illustrative embodiment. Operation begins, and the mechanism receives an array, arr (block 1202). For each read port, R_i (block 1204), the mechanism identifies a mask, M, for which all connected arrayouts of port R_i are masked with respect to some fanout boundary (block 1206). The mechanism simplifies the enable of R_i using NOT(M) as a "don't care" condition (block 1208). Then, the mechanism considers the next read port (block 1210) and returns to block 1204 to repeat the loop for the next read port. If the mechanism has considered the last read port in block 1210, then operation ends.

FIG. 13 depicts example pseudo-code for the operations illustrated in FIG. 12 in accordance with an illustrative embodiment. This mechanism uses observability don't care conditions to simplify arrays. In this case, instead of merging read ports, the mechanism uses such conditions to directly simplify read enable pins. Often, this transformation allows tying enable pins to 1, which may simplify other analysis, e.g., preventing the need to ever model an arrayout as randomized.

FIG. 14 is a flowchart illustrating operation of a mechanism for bypassing write-before-read ports in a memory array in accordance with an illustrative embodiment. Operation begins, and the mechanism receives an array, an (block 1402). The mechanism determines whether the array is a write-before-read array (block 1404). If the array is not a write-before-read array, then operation ends.

If the mechanism determines that the array is a write-before-read array in block 1404, then for each read port R_i (block 1406), the mechanism checks whether there exists any write port, W_j, that address matches the read port, and every time the read port is enabled the write port is also enabled (block 1408). The mechanism determines whether such a write port exists (block 1410). If such a write port exists, then for each column, if W_j data is connected, the mechanism merges R_i data for the column onto W_j data (block 1412). Thereafter, or if no such write port exists in block 1410, the mechanism considers the next read port (block 1414) and returns to block 1406 to repeat the loop for the next read port. If the mechanism has considered the last read port in block 1414, then operation ends.

FIG. 15 depicts example pseudo-code for the operations illustrated in FIG. 14 in accordance with an illustrative embodiment. This mechanism attempts to simplify write-before-read arrays by bypassing arrayouts to write data. In particular, if there are any write ports that address match a particular enabled read port, and every time that read port is enabled the write port is also enabled, the read port will always fetch the write data. This sort of optimization may frequently be possible due to cases where an array is conservatively created by a hardware description language (HDL) compiler even though read values may be concurrently determined without referring to prior assignments to the corresponding signal.

FIG. 16 is a flowchart illustrating operation of a mechanism for concatenation of memory arrays in accordance with an illustrative embodiment. Operation begins, and the mechanism receives a netlist, N (block 1602). For each array in N, the mechanism generates and stores initialization, write, and read port compatibility lists (block 1604). For each pair of arrays, arr1 and arr2 (block 1606), the mechanism determines whether arr1 and arr2 are the same type and compatible based on their compatibility lists (block 1608). If arr1 and arr2 are the same type and compatible (block 1608), then the mechanism concatenates default initial values and data pins of each port of arr2 onto the compatible port of arr1 (block 1610). Then, the mechanism disconnects the corresponding pins of arr2 (block 1612) and deletes arr2 (block 1614). Thereafter, or if arr1 and arr2 are not the same type and compatible in block 1608, the mechanism considers the next pair of arrays (block 1616) and returns to block 1606 to repeat the loop for the next pair of arrays. If the mechanism has considered the last pair of arrays in block 1616, then operation ends.

FIG. 17 depicts example pseudo-code for the operations illustrated in FIG. 16 in accordance with an illustrative embodiment. This mechanism is focused on reducing the number of arrays in the netlist, which is advantageous because analysis frameworks benefit from the ability to move more data with less evaluation of enable and address pins. This transformation consists of enumerating compatibility lists for each port, although only with respect to enables and address pins. After enumeration, the mechanism looks for one-to-one compatibility of ports. If the mechanism finds such compatibility, then the mechanism data-concatenates the corresponding array ports and eliminates one of the arrays.

Figure 18:
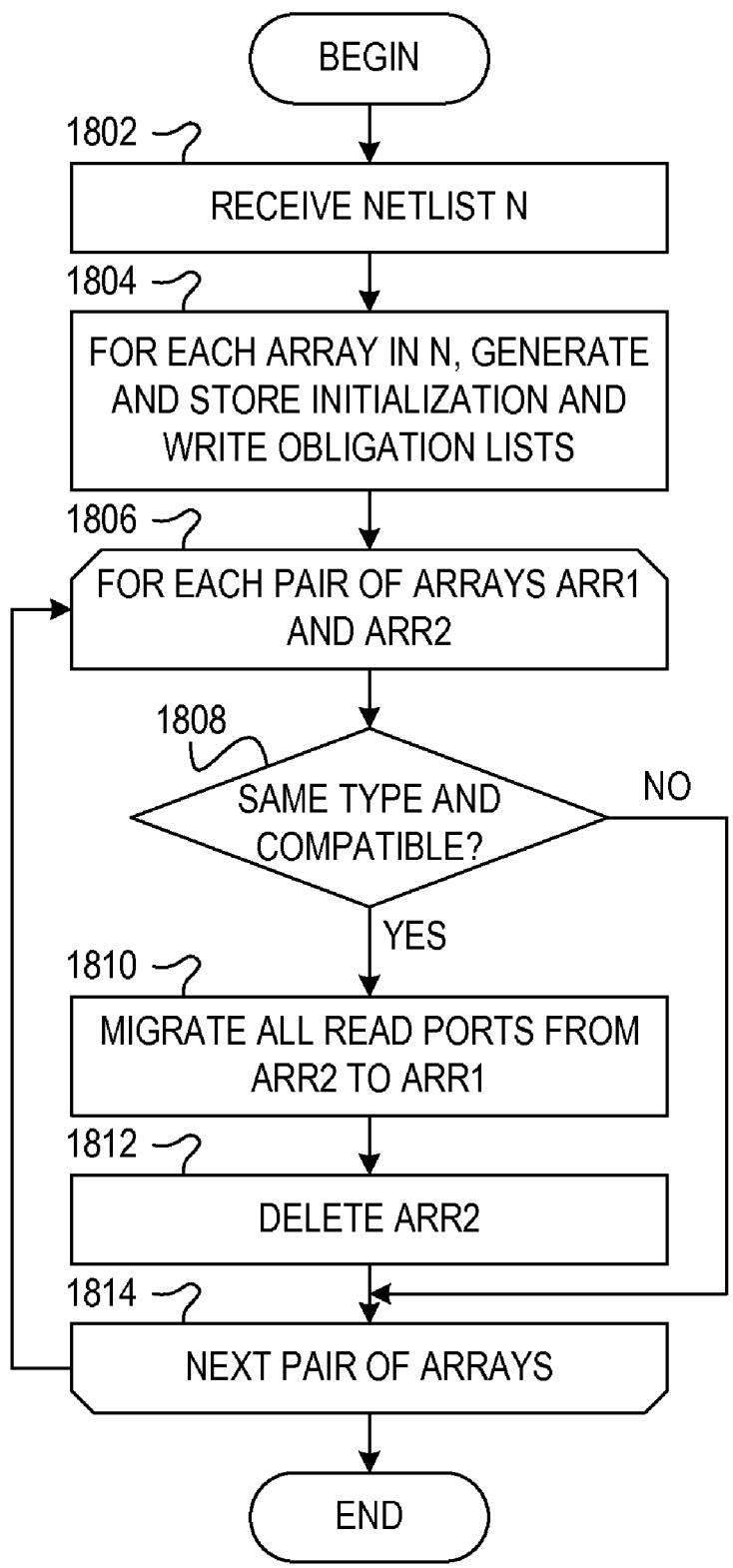
FIG. 18 is a flowchart illustrating operation of a mechanism for migrating array read ports in accordance with an illustrative embodiment.

FIG. 18 is a flowchart illustrating operation of a mechanism for migrating array read ports in accordance with an illustrative embodiment. Operation begins, and the mechanism receives a netlist, N (block 1802). For each array in N, the mechanism generates and stores initialization and write port obligation lists (block 1804). Note that unlike the operation described with reference to FIG. 16, the mechanism does not check for read port obligations.

For each pair of arrays, arr1 and arr2 (block 1806), the mechanism determines whether arr1 and arr2 are the same type and are compatible based on their obligation lists (block 1808). If arr1 and arr2 are the same type and compatible, the mechanism migrates all read ports from arr2 to arr1 (block 1810) and deletes arr2 (block 1812). Thereafter, or if arr1 and arr2 are not the same type and compatible in block 1808, the mechanism considers the next pair of arrays (block 1814) and returns to block 1806 to repeat the loop for the next pair of arrays. If the mechanism has considered the last pair of arrays in block 1814, then operation ends.

FIGS. 19A and 19B depict example pseudo-code for the operations illustrated in FIG. 18 in accordance with an illustrative embodiment. This mechanism attempts to merge arrays in a different way, by migrating read ports across all arrays whose data are compatible. This generalizes redundancy removal approaches because it does not require read ports to be compatible.

FIG. 20 is a flowchart illustrating operation of a mechanism to minimize address bits in a memory array in accordance with an illustrative embodiment. Operation begins, and the mechanism receives an array, arr (block 2002). The mechanism determines whether the number of address pins is excessively large (block 2004). If the number of address pins is excessively large in block 2004, the mechanism projects out the most significant address bits (block 2006). Thereafter, or if the number of address pins is not excessively large in block 2004, the mechanism determines whether any address bits have the same constant value across all read ports (block 2008). If any address bits have the same constant value across all read ports, the mechanism projects those address bits out of the address (bock 2010). Thereafter, or if there are not any address bits that have the same constant value in block 2008, the mechanism computes a new number of rows (block 2012), and operation ends.

FIGS. 21A and 21B depict an example pseudo-code for the operations illustrated in FIG. 20 in accordance with an illustrative embodiment. This mechanism reduces the number of address pins of any array in two ways. First, if the number of address pins is excessively large, e.g., able to address twice or greater than twice the maximum number of rows, the mechanism projects out the most significant address bits by conjuncting the inverse of those most significant address bits with the enable for every port, so that accesses beyond the top row are dropped. Second, the mechanism checks if any address bits of all read ports are the same constant value. If so, the mechanism projects those bits out of the address. In addition, the mechanism computes the new number of rows across these projections.

FIG. 22 is a flowchart illustrating operation of a mechanism for array deletion in accordance with an illustrative embodiment. Operation begins, and the mechanism receives a netlist, N (block 2202). For each array, arr, in N (block 2204), the mechanism determines whether the array has no read ports or no columns or zero rows (block 2206). If the array has no read ports or no columns or zero rows, the mechanism deletes the array (block 2208). Thereafter, or if the array has one or more read ports and one or more columns and one or more rows in block 2206, the mechanism considers the next array (block 2210) and returns to block 2204 to repeat the loop for the next array. If the mechanism has considered the last array in block 2210, then operation ends.

FIG. 23 depicts example pseudo-code for the operations illustrated in FIG. 22 in accordance with an illustrative embodiment. This mechanism provides criteria by which the mechanism may delete an array, namely if an array has no read ports, no rows, or no columns. The first condition may be a byproduct of other transformations, such as the transformation described above with reference to FIGS. 16 and 17. The second condition may be a byproduct of transformations, such as the transformation described above with reference to FIGS. 20 and 21. Note that in such a case, every address would be out-of-bounds, hence randomized.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 24:
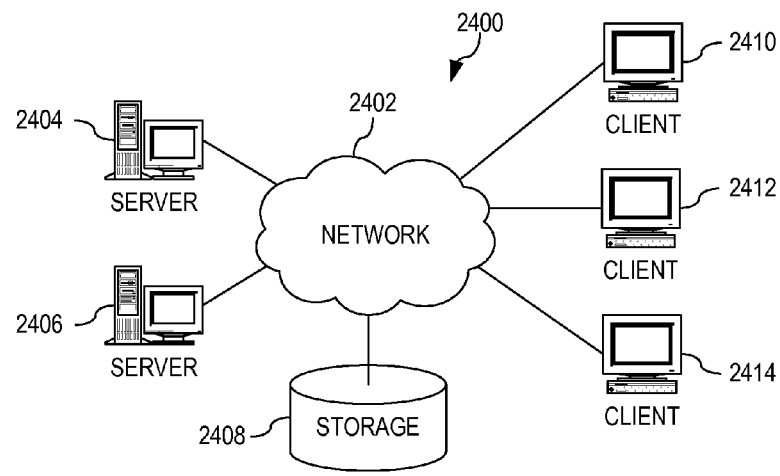
FIG. 24 depicts a pictorial representation of an example distributed data processing system in which aspects of the illustrative embodiments may be implemented.
Figure 25:
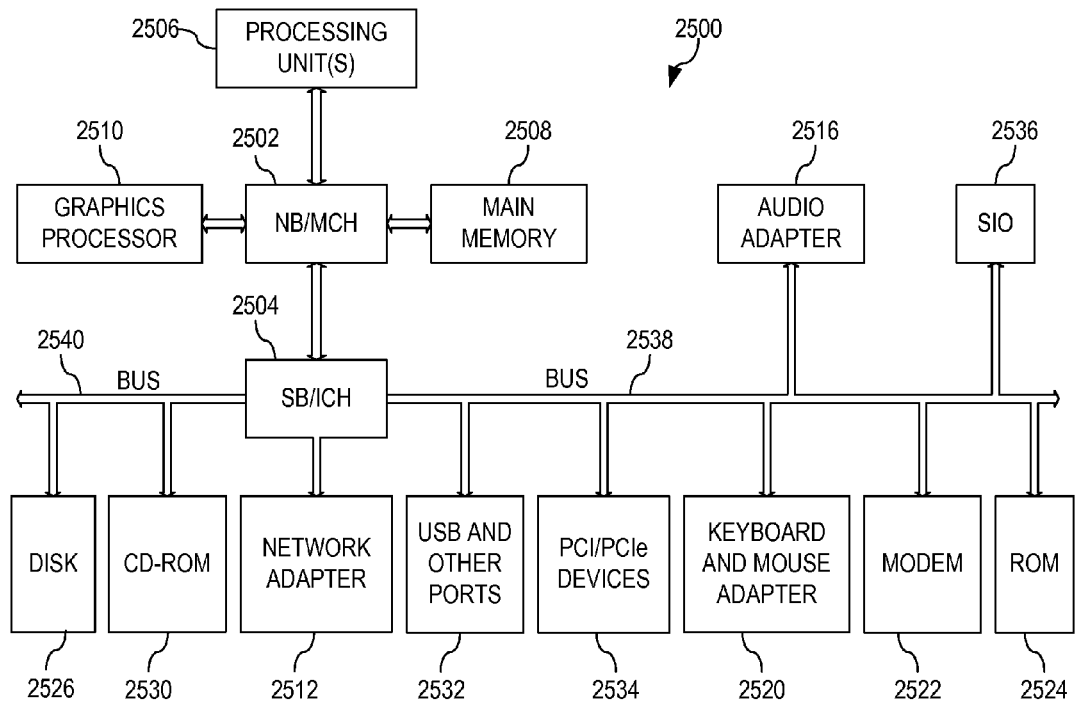
FIG. 25 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIGS. 24 and 25 are provided hereafter as example environments in which aspects of the illustrative embodiments may be implemented. While the description following FIGS. 24 and 25 will focus primarily on a single data processing device implementation, this is only an example and is not intended to state or imply any limitation with regard to the features of the present invention. To the contrary, the illustrative embodiments are intended to include distributed data processing environments and embodiments.

With reference now to the figures and in particular with reference to FIGS. 24 and 25, example diagrams of data processing environments are provided in which illustrative embodiments of the present invention may be implemented. It should be appreciated that FIGS. 24 and 25 are only examples and are not intended to assert or imply any limitation with regard to the environments in which aspects or embodiments of the present invention may be implemented. Many modifications to the depicted environments may be made without departing from the spirit and scope of the present invention.

FIG. 24 depicts a pictorial representation of an example distributed data processing system in which aspects of the illustrative embodiments may be implemented. Distributed data processing system 2400 may include a network of computers in which aspects of the illustrative embodiments may be implemented. The distributed data processing system 2400 contains at least one network 2402, which is the medium used to provide communication links between various devices and computers connected together within distributed data processing system 2400. The network 2402 may include connections, such as wire, wireless communication links, or fiber optic cables.

In the depicted example, server 2404 and server 2406 are connected to network 2402 along with storage unit 2408. In addition, clients 2410, 2412, and 2414 are also connected to network 2402. These clients 2410, 2412, and 2414 may be, for example, personal computers, network computers, or the like. In the depicted example, server 2404 provides data, such as boot files, operating system images, and applications to the clients 2410, 2412, and 2414. Clients 2410, 2412, and 2414 are clients to server 2404 in the depicted example. Distributed data processing system 2400 may include additional servers, clients, and other devices not shown.

In the depicted example, distributed data processing system 2400 is the Internet with network 2402 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 2400 may also be implemented to include a number of different types of networks, such as for example, an intranet, a local area network (LAN), a wide area network (WAN), or the like. As stated above, FIG. 24 is intended as an example, not as an architectural limitation for different embodiments of the present invention, and therefore, the particular elements shown in FIG. 24 should not be considered limiting with regard to the environments in which the illustrative embodiments of the present invention may be implemented.

With reference now to FIG. 25, a block diagram of an example data processing system is shown in which aspects of the illustrative embodiments may be implemented. Data processing system 2500 is an example of a computer, such as client 2410 in FIG. 24, in which computer usable code or instructions implementing the processes for illustrative embodiments of the present invention may be located.

In the depicted example, data processing system 2500 employs a hub architecture including north bridge and memory controller hub (NB/MCH) 2502 and south bridge and input/output (I/O) controller hub (SB/ICH) 2504. Processing unit 2506, main memory 2508, and graphics processor 2510 are connected to NB/MCH 2502. Graphics processor 2510 may be connected to NB/MCH 2502 through an accelerated graphics port (AGP).

In the depicted example, local area network (LAN) adapter 2512 connects to SB/ICH 2504. Audio adapter 2516, keyboard and mouse adapter 2520, modem 2522, read only memory (ROM) 2524, hard disk drive (HDD) 2526, CD-ROM drive 2530, universal serial bus (USB) ports and other communication ports 2532, and PCI/PCIe devices 2534 connect to SB/ICH 2504 through bus 2538 and bus 2540. PCI/PCIe devices may include, for example, Ethernet adapters, add-in cards, and PC cards for notebook computers. PCI uses a card bus controller, while PCIe does not. ROM 2524 may be, for example, a flash basic input/output system (BIOS).

HDD 2526 and CD-ROM drive 2530 connect to SB/ICH 2504 through bus 2540. HDD 2526 and CD-ROM drive 2530 may use, for example, an integrated drive electronics (IDE) or serial advanced technology attachment (SATA) interface. Super I/O (SIO) device 2536 may be connected to SB/ICH 2504.

An operating system runs on processing unit 2506. The operating system coordinates and provides control of various components within the data processing system 2500 in FIG. 25. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 2500 (Java is a trademark of Sun Microsystems, Inc. in the United States, other countries, or both).

As a server, data processing system 2500 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 2500 may be a symmetric multiprocessor (SMP) system including a plurality of processors in processing unit 2506. Alternatively, a single processor system may be employed.

Instructions for the operating system, the object-oriented programming system, and applications or programs are located on storage devices, such as HDD 2526, and may be loaded into main memory 2508 for execution by processing unit 2506. The processes for illustrative embodiments of the present invention may be performed by processing unit 2506 using computer usable program code, which may be located in a memory such as, for example, main memory 2508, ROM 2524, or in one or more peripheral devices 2526 and 2530, for example.

A bus system, such as bus 2538 or bus 2540 as shown in FIG. 25, may be comprised of one or more buses. Of course, the bus system may be implemented using any type of communication fabric or architecture that provides for a transfer of data between different components or devices attached to the fabric or architecture. A communication unit, such as modem 2522 or network adapter 2512 of FIG. 25, may include one or more devices used to transmit and receive data. A memory may be, for example, main memory 2508, ROM 2524, or a cache such as found in NB/MCH 2502 in FIG. 25.

Those of ordinary skill in the art will appreciate that the hardware in FIGS. 24 and 25 may vary depending on the implementation. Other internal hardware or peripheral devices, such as flash memory, equivalent non-volatile memory, or optical disk drives and the like, may be used in addition to or in place of the hardware depicted in FIGS. 24 and 25. Also, the processes of the illustrative embodiments may be applied to a multiprocessor data processing system, other than the SMP system mentioned previously, without departing from the spirit and scope of the present invention.

Moreover, the data processing system 2500 may take the form of any of a number of different data processing systems including client computing devices, server computing devices, a tablet computer, laptop computer, telephone or other communication device, a personal digital assistant (PDA), or the like. In some illustrative examples, data processing system 2500 may be a portable computing device which is configured with flash memory to provide non-volatile memory for storing operating system files and/or user-generated data, for example. Essentially, data processing system 2500 may be any known or later developed data processing system without architectural limitation.

Thus, the illustrative embodiments provide mechanisms in a design environment for minimizing memory array representations for enhanced synthesis and verification. In one embodiment, the design environment comprises a mechanism to compress the width of arrays using disconnected pin information. In another embodiment, the design environment comprises a mechanism to simplify the enable conditions of array ports using "don't care" computations. In yet another embodiment, the design environment comprises a mechanism to reduce address pins from an array through analysis of limitations of readable addresses.

The illustrative embodiments provide mechanisms in a design environment for eliminating, coalescing, or bypassing ports. In one embodiment, the design environment comprises a mechanism to eliminate unnecessary ports in arrays using disabled and disconnected pin information. In another embodiment, the design environment comprises a mechanism to combine and reduce the number of array ports using address comparisons. In another embodiment, the design environment comprises a mechanism to combine and reduce the number of array ports using disjoint enable comparisons. In yet another embodiment, the design environment comprises a mechanism to combine and reduce the number of array ports using "don't care" computations. In another embodiment, the design environment comprises a mechanism to reduce the number of array ports through bypassing write-to-read paths around arrays.

The illustrative embodiments also provide mechanisms in a design environment for array concatenation. In one embodiment, the design environment comprises a mechanism to concatenate arrays with enable- and address-compatible ports, thereby reducing the number of arrays in a netlist. In another embodiment, the design environment comprises a mechanism to migrate read ports from one array to another based upon compatible enable-, address-, and data-compatible write ports, thereby reducing the number of arrays in a netlist. In yet another embodiment, the design environment comprises a mechanism to eliminate unnecessary arrays.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for minimizing memory array representations, the method comprising:
   receiving, in the data processing system, an integrated circuit design having a memory array;
   reducing, by the data processing system, a number of ports in the memory array in the integrated circuit design to form a reduced integrated circuit design; and
   performing, by the data processing system, synthesis or verification on the reduced integrated circuit design,
   wherein reducing the number of ports in the memory array comprises:
      responsive to a determination that the memory array is a write-before-read array, identifying a read port and a write port wherein the write port address matches the read port and every time the read port is enabled, the write port is also enabled; and
      for each connected write pin, merging a corresponding read pin onto the connected write pin.

2. The method of claim 1, wherein reducing the number of ports in the memory array further comprises:
  identifying one or more ports in the memory array that can never be enabled or have no data pins connected; and
  deleting the one or more ports.

3. The method of claim 2, wherein reducing the number of ports in the memory array further comprises:
  responsive to a given port within the one or more ports being a read port, converting each arrayout of the given port to a random gate.

4. The method of claim 1, wherein reducing the number of ports in the memory array further comprises:
  identifying two or more ports in the memory array that have equivalent addresses; and
  coalescing the two or more ports in the memory array.

5. The method of claim 4, wherein identifying two or more ports in the memory array that have equivalent addresses comprises identifying a given port and a higher precedence port, wherein the given port is an initialization port or a write port and wherein the higher precedence port is guaranteed to write the same address whenever the given port writes;
  wherein coalescing the two or more ports in the memory array comprises eliminating the given port.

6. The method of claim 4, wherein identifying two or more ports in the memory array that have equivalent addresses comprises identifying a given port, wherein the given port is an initialization port or a write port, wherein an enable of the given port implies an enable of a higher precedence port, and wherein no intermediate port can concurrently write to a same address as the given port and the higher precedence port; and
  wherein coalescing the two or more ports in the memory array comprises using the higher priority port to subsume the given port.

7. The method of claim 4, wherein identifying two or more ports in the memory array that have equivalent addresses comprises identifying a first read port and a second read port, wherein the first read port and the second read port have equivalent addresses and an enable of one of the first read port or the second read port implies an enable of the other of the first read port or the second read port; and
  wherein coalescing the two or more ports in the memory array comprises merging the arrayouts of the implied one of the first read port or the second read port with the arrayouts of the other of the first read port or the second read port.

8. The method of claim 4, wherein identifying two or more ports in the memory array that have equivalent addresses comprises identifying a first read port and a second read port, wherein the first read port and the second read port have equivalent addresses, an enable of the first read port does not imply an enable of the second read port, and an enable of the second read port does not imply an enable of the first read port; and
  wherein coalescing the two or more ports in the memory array comprises creating a new read port and merging arrayouts of the first read port and the second read ports onto arrayouts of the new read port.

9. The method of claim 1, wherein reducing the number of ports in the memory array further comprises:
  identifying two or more ports in the memory array that have orthogonal enables; and
  coalescing the two or more ports in the memory array.

10. The method of claim 9, wherein coalescing the two or more ports in the memory array comprises:
  for initialization ports or write ports, migrating write pins from a lower-precedence port to a higher-precedence port as long as no intermediate port can concurrently write to the same address of the higher-precedence port.

11. The method of claim 9, wherein coalescing the two or more ports in the memory array comprises:
  for a first read port and a second read port in the memory array, creating a new read port and merging arrayouts of the first read port and the second read ports onto arrayouts of the new read port.

12. The method of claim 1, wherein reducing the number of ports in the memory array further comprises:
  for each given read port, identifying a mask for which all connected arrayouts of the given read port are masked with respect to a fanout boundary;
  identifying a first read port and a second read port a compliment of the mask of the first read port AND a compliment of the mask of the second read port are equivalent; and
  merging the first read port and the second read port.

13. The method of claim 12, wherein merging the first read port and the second read port comprises creating a new read port and merging arrayouts of the first read port and the second read ports onto arrayouts of the new read port.

14. A computer program product comprising a non-transitory computer readable storage medium having a computer readable program stored therein, wherein the computer readable program, when executed on a computing device, causes the computing device to:
  receive, in the computing device, an integrated circuit design having a memory array;
  reduce, by the computing device, a number of ports in the memory array in the integrated circuit design to form a reduced integrated circuit design; and
  perform, by the computing device, synthesis or verification on the reduced integrated circuit design,
  wherein reducing the number of ports in the memory array comprises:
    responsive to a determination that the memory array is a write-before-read array, identifying a read port and a write port, wherein the write port address matches the read port and every time the read port is enabled, the write port is also enabled; and
    for each connected write pin, merging a corresponding read pin onto the connected write pin.

15. The computer program product of claim 14, wherein reducing the number of ports in the memory array further comprises:
  identifying one or more ports in the memory array that can never be enabled or have no data pins connected; and
  deleting the one or more ports.

16. The computer program product of claim 14, wherein reducing the number of ports in the memory array further comprises:
  identifying two or more ports in the memory array that have equivalent addresses; and
  coalescing the two or more ports in the memory array.

17. The computer program product of claim 14, wherein reducing the number of ports in the memory array further comprises:
  identifying two or more ports in the memory array that have orthogonal enables; and
  coalescing the two or more ports in the memory array.

18. The computer program product of claim 14, wherein reducing the number of ports in the memory array further comprises:
  for each given read port, identifying a mask for which all connected arrayouts of the given read port are masked with respect to a fanout boundary;

identifying a first read port and a second read port a compliment of the mask of the first read port AND a compliment of the mask of the second read port are equivalent; and merging the first read port and the second read port.

19. The computer program product of claim 14, wherein the computer readable program is stored in a computer readable storage medium in a data processing system and wherein the computer readable program was downloaded over a network, from a remote data processing system.

20. The computer program product of claim 14, wherein the computer readable program is stored in a computer readable storage medium in a server data processing system and wherein the computer readable program is downloaded over a network to a remote data processing system for use in a computer readable storage medium with the remote system.

21. An apparatus, comprising:
a processor; and
a memory coupled to the processor, wherein the memory comprises instructions which, when executed by the processor, cause the processor to:
receive an integrated circuit design having a memory array;
reduce a number of ports in the memory array in the integrated circuit design to form a reduced integrated circuit design; and
perform synthesis or verification on the reduced integrated circuit design,
wherein reducing the number of ports in the memory array comprises:
responsive to a determination that the memory array is a write-before-read array, identifying a read port and a write port, wherein the write port address matches the read port and every time the read port is enabled, the writeport is also enabled; and
for each connected write pin, a corresponding read pin onto the connected write pin.

22. The apparatus of claim 21, wherein reducing the number of ports in the memory array further comprises:
identifying one or more ports in the memory array that can never be enabled or have no data pins connected; and
deleting the one or more ports.

23. The apparatus of claim 21, wherein reducing the number of ports in the memory array further comprises:
identifying two or more ports in the memory array that have equivalent addresses; and
coalescing the two or more ports in the memory array.

* * * * *